(12) United States Patent
Graham

(10) Patent No.: US 12,082,374 B2
(45) Date of Patent: Sep. 3, 2024

(54) HEATSINKS COMPRISING A PHASE CHANGE MATERIAL

(71) Applicant: Simmonds Precision Products, Inc., Vergennes, VT (US)

(72) Inventor: Jason Graham, Prior Lake, MN (US)

(73) Assignee: Simmonds Precision Products, Inc., Vergennes, VT (US)

( * ) Notice: Subject to any disclaimer, the term of this patent is extended or adjusted under 35 U.S.C. 154(b) by 81 days.

(21) Appl. No.: 17/497,671

(22) Filed: Oct. 8, 2021

(65) Prior Publication Data

US 2023/0110020 A1    Apr. 13, 2023

(51) Int. Cl.
*H05K 7/20* (2006.01)
*H05K 1/02* (2006.01)

(52) U.S. Cl.
CPC ......... *H05K 7/2039* (2013.01); *H05K 1/0203* (2013.01)

(58) Field of Classification Search
CPC ............................ H05K 7/2039; H05K 1/0203
See application file for complete search history.

(56) References Cited

U.S. PATENT DOCUMENTS

| | | | |
|---|---|---|---|
| 5,315,154 A | 5/1994 | Elwell | |
| 5,946,190 A * | 8/1999 | Patel | F28F 3/02 |
| | | | 257/722 |
| 6,119,573 A * | 9/2000 | Berens | B64G 1/50 |
| | | | 89/1.816 |
| 6,307,871 B1 * | 10/2001 | Heberle | H01S 3/042 |
| | | | 372/36 |
| 6,317,321 B1 * | 11/2001 | Fitch | G06F 1/203 |
| | | | 174/15.2 |
| 6,351,478 B1 * | 2/2002 | Heberle | H01S 3/042 |
| | | | 372/39 |
| 7,345,320 B2 * | 3/2008 | Dahm | F21V 29/51 |
| | | | 257/104 |
| 8,671,570 B2 * | 3/2014 | Liu | H01L 23/427 |
| | | | 29/890.032 |
| 9,036,352 B2 * | 5/2015 | Engelhardt | H05K 1/021 |
| | | | 361/720 |
| 9,447,995 B2 * | 9/2016 | Bloedow | F25B 21/04 |
| 9,728,868 B1 * | 8/2017 | Lostetter | H01L 23/4275 |
| 9,918,407 B2 * | 3/2018 | Rosales | H05K 7/20436 |

(Continued)

FOREIGN PATENT DOCUMENTS

| | | |
|---|---|---|
| CN | 112351650 A | 2/2021 |
| JP | 2012099612 A | 5/2012 |
| WO | 03046982 A1 | 6/2003 |

OTHER PUBLICATIONS

Extended European Search Report, of the European Patent Office, mailed on Mar. 6, 2023, in corresponding European Patent Application No. 22200341.0.

*Primary Examiner* — Timothy J Thompson
*Assistant Examiner* — Rhadames Alonzo Miller
(74) *Attorney, Agent, or Firm* — Schwegman Lundberg & Woessner, P.A.

(57) ABSTRACT

A heatsink can include a body, one or more thermal fin arrays defined by and/or extending from the body, and a phase change material disposed in contact with the one or more fin arrays. The phase change material can be configured to be a first phase in a cool state and a second phase in a heated state. The phase change material is configured to be cooled back to the solid state.

10 Claims, 2 Drawing Sheets

(56) References Cited

U.S. PATENT DOCUMENTS

| | | | |
|---|---|---|---|
| 10,043,732 B1* | 8/2018 | Al Omari | F28D 20/025 |
| 10,276,472 B2* | 4/2019 | Spann | H01L 23/3735 |
| 10,859,330 B1* | 12/2020 | Cola | H02S 40/42 |
| 10,948,238 B2* | 3/2021 | Hulse | F28D 15/0233 |
| 10,969,177 B2 | 4/2021 | Bouras | |
| 2002/0033247 A1* | 3/2002 | Neuschutz | F28D 15/02 |
| | | | 165/10 |
| 2002/0144811 A1* | 10/2002 | Chou | F28D 20/02 |
| | | | 165/104.11 |
| 2005/0007740 A1* | 1/2005 | Neuschuetz | H01L 23/4275 |
| | | | 257/E23.089 |
| 2005/0104029 A1* | 5/2005 | Neuschuetz | H01L 23/4275 |
| | | | 257/E23.089 |
| 2005/0231983 A1* | 10/2005 | Dahm | H01L 33/00 |
| | | | 433/29 |
| 2006/0151146 A1* | 7/2006 | Chou | H01L 23/427 |
| | | | 165/10 |
| 2006/0238984 A1* | 10/2006 | Belady | H01L 23/42 |
| | | | 257/E23.098 |
| 2006/0278370 A1* | 12/2006 | Rockenfeller | F28D 15/0233 |
| | | | 165/104.33 |
| 2008/0003649 A1* | 1/2008 | Maltezos | B01L 3/50851 |
| | | | 435/286.1 |
| 2008/0264614 A1* | 10/2008 | Szolyga | H05K 5/0213 |
| | | | 165/104.33 |
| 2009/0141456 A1* | 6/2009 | Juett | H05K 3/4641 |
| | | | 361/721 |
| 2010/0101621 A1* | 4/2010 | Xu | F24S 20/20 |
| | | | 136/206 |
| 2010/0277868 A1* | 11/2010 | Beaupre | H01L 23/473 |
| | | | 361/700 |
| 2011/0115227 A1* | 5/2011 | Shafer | F02K 3/115 |
| | | | 290/52 |
| 2012/0023893 A1* | 2/2012 | Yoo | F28F 3/048 |
| | | | 60/39.83 |
| 2013/0341553 A1* | 12/2013 | Amarel | F41A 21/34 |
| | | | 252/62 |
| 2015/0343588 A1* | 12/2015 | Weiss | F28D 15/00 |
| | | | 165/104.17 |
| 2016/0097857 A1* | 4/2016 | Gokay | G01S 17/42 |
| | | | 356/5.01 |
| 2017/0043189 A1* | 2/2017 | Stoddard | G10K 11/24 |
| 2018/0132383 A1* | 5/2018 | Howe | H05K 7/20518 |
| 2018/0216898 A1* | 8/2018 | Ockfen | F42B 15/34 |
| 2018/0306524 A1* | 10/2018 | Horovitz | F28D 20/0056 |
| 2019/0016419 A1* | 1/2019 | Sheldon-Coulson | B63H 21/00 |
| 2019/0212073 A1* | 7/2019 | Bouras | F28F 3/022 |
| 2019/0252284 A1* | 8/2019 | Spann, Jr. | H01L 23/053 |
| 2019/0288351 A1* | 9/2019 | Son | H01M 10/42 |
| 2019/0304873 A1* | 10/2019 | Kedem | H05K 7/20327 |
| 2020/0335421 A1* | 10/2020 | Kedem | H05K 1/0272 |
| 2021/0033371 A1* | 2/2021 | Frey, Jr. | G01J 1/0219 |
| 2021/0180873 A1* | 6/2021 | Lin | H01L 23/427 |
| 2021/0195798 A1* | 6/2021 | Neal | H01L 23/3675 |
| 2021/0327786 A1* | 10/2021 | Kedem | H05K 1/0272 |
| 2021/0381736 A1* | 12/2021 | Rockenfeller | F41H 13/005 |

* cited by examiner

HEATSINKS COMPRISING A PHASE CHANGE MATERIAL

STATEMENT OF GOVERNMENT RIGHTS

This invention was made with government support under contract no. DOTC-19 INIT0911 awarded by the Department of the Army. The government has certain rights in the invention.

FIELD

This disclosure relates to heatsinks for electronics.

BACKGROUND

There is an ever increasing need for smaller SWAP (size, weight and power) of electronics in guided munitions. As the size of these electronics decreases, the power density can drastically increase, resulting in the need for new thermal mitigation techniques. Traditional heatsinking can only do so much, there are limits to how quickly heat can travel.

Conventional methods and systems have generally been considered satisfactory for their intended purpose. However, there is still a need in the art for improved heatsinks. The present disclosure provides a solution for this need.

SUMMARY

A heatsink can include a body, one or more thermal fin arrays defined by and/or extending from the body, and a phase change material disposed in contact with the one or more fin arrays. The phase change material can be configured to be a first phase (e.g., solid or liquid) in a cool state and a second phase (e.g., liquid or gas) in a heated state. The phase change material can be configured to be cooled back to the solid state.

The heatsink can include one or more reservoirs defined by the body configured to be in fluid communication with the one or more thermal fin arrays. The phase change material can be disposed within the one or more reservoirs and configured to create a larger heat absorbing mass of phase change material.

The one or more reservoirs and the one or more thermal fin arrays can be in fluid communication via one or more channels. The one or more thermal fin arrays, the one or more channels, and/or the one or more reservoirs can be open to an atmosphere such that the one or more thermal fin arrays and/or the one or more reservoirs are in fluid communication with an atmosphere (e.g., such that the phase change material is not sealed within the body).

The one or more thermal fin arrays can include a plurality of thermal fin arrays spaced apart from each other. In certain embodiments, a location and/or size of each of the plurality of fin arrays can correlate to a position of a component on a circuit board. In certain embodiments, at least two of the thermal fin arrays can have different sized thermal fins.

In certain embodiments, all thermal fin arrays and all reservoirs can be in fluid communication with each other such that all thermal fin arrays and all reservoirs share the same volume of phase change material. In certain embodiments, the one or more reservoirs include a plurality of reservoirs.

In certain embodiments, a contact surface (e.g., a surface of the body opposite a surface having the thermal fins) can be configured to connect to a circuit board. For example, the contact surface can be flat. Any suitable shape is contemplated herein.

In accordance with at least one aspect of this disclosure, an electronics system can include a circuit board having one or more components that output heat. The system can also include a heatsink attached to the one or more components and/or the circuit board to be in thermal communication with the one or more components. The heatsink can be any suitable embodiment of a heatsink disclosed herein, e.g., as described above. The electronics system can be utilized with any suitable single use device (e.g., a projectile) and/or any other suitable device.

In accordance with at least one aspect of this disclosure, a single use device can include any suitable embodiment of an electronics system as disclosed herein (e.g., as described above). In certain embodiments, the phase change material of the heatsink may not be sealed within the heatsink. Any suitable single use device (e.g., a projectile) and/or any other suitable device is contemplated herein.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
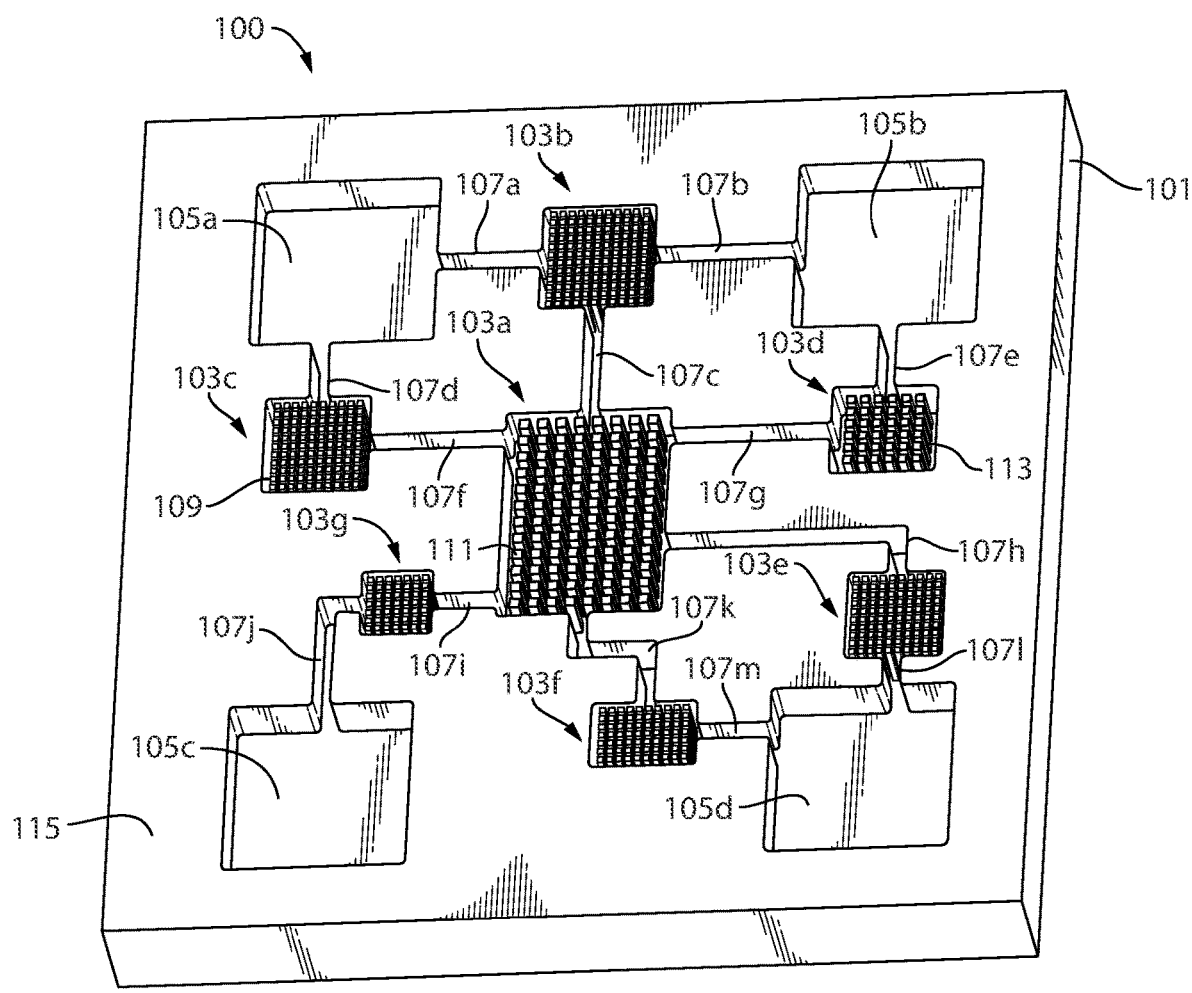
FIG. 1 is a perspective view of an embodiment of a heatsink in accordance with this disclosure.
Figure 2:
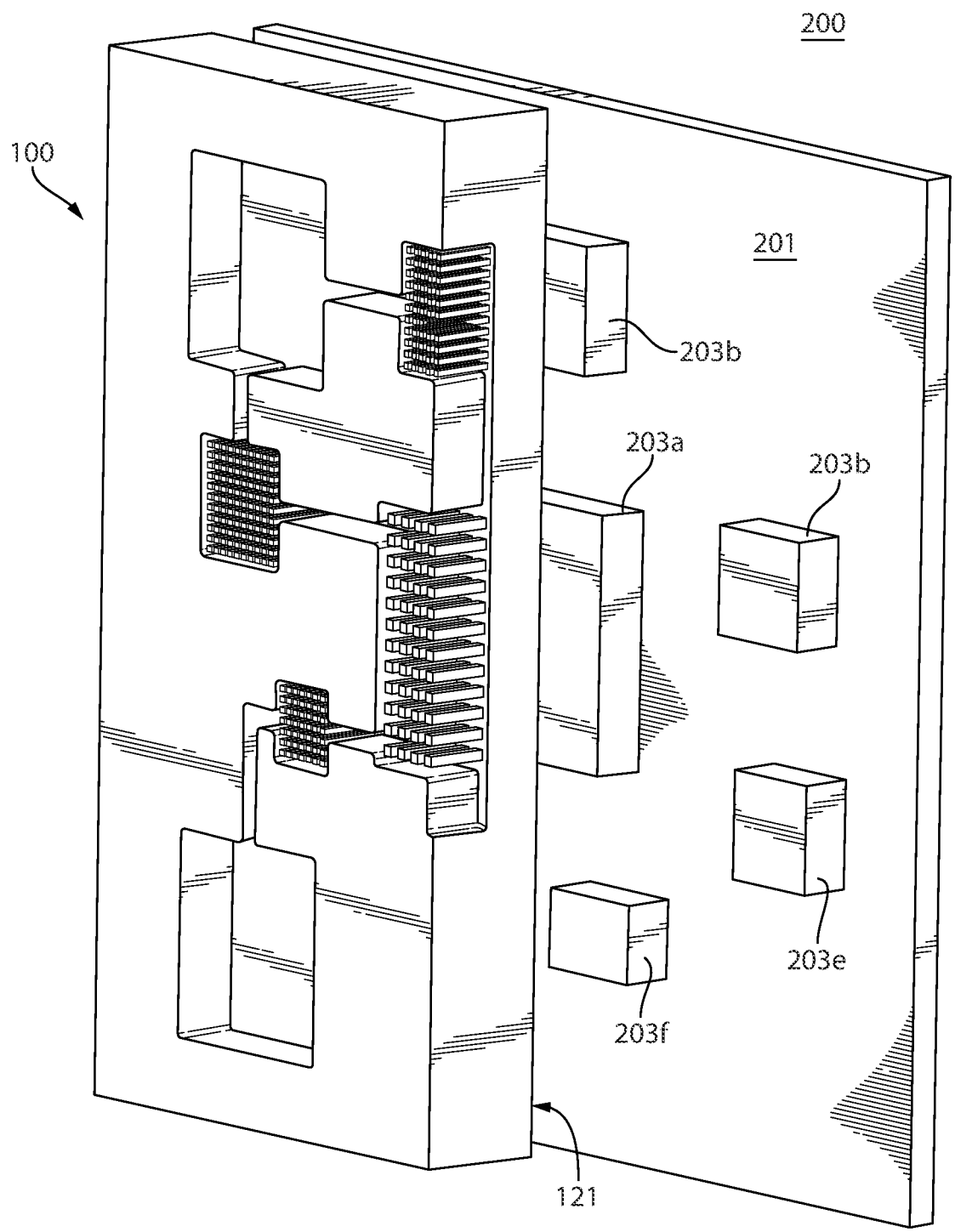
FIG. 2 is a cutaway view of the embodiment of FIG. 1, shown disposed over an embodiment of an electrical circuit and showing a correlation between components and thermal fin array location and/or size.

Reference will now be made to the drawings wherein like reference numerals identify similar structural features or aspects of the subject disclosure. For purposes of explanation and illustration, and not limitation, an illustrative view of an embodiment of a heatsink in accordance with the disclosure is shown in FIG. 1 and is designated generally by reference character 100. Other embodiments and/or aspects of this disclosure are shown in FIG. 2.

In accordance with at least one aspect of this disclosure, a heatsink 100 can include a body 101, one or more thermal fin arrays 103a, b, c, d, e, f, g defined by and/or extending from the body 101. The body 101 can include any suitable shape (e.g., a planar rectangular shape) configured to operate as a heatsink for any suitable application.

The heatsink 100 can include a phase change material (not shown for clarity) disposed in contact with the one or more fin arrays 103a, b, c, d, e, f, g. In certain embodiments, the phase change material can fill all spaces within the body 101 (e.g., all spaces within the thermal fin arrays 103a, b, c, d, e, f, g). The phase change material can be configured to be a first phase (e.g., solid or liquid) in a cool state and a second phase (e.g., liquid or gas) in a heated state. The phase change material can be configured to be cooled back to the solid state. Any suitable amount/volume of phase change material is contemplated herein. Any suitable type of phase change material (e.g., paraffin wax, e.g., doped with graphite) is contemplated herein.

The heatsink 100 can include one or more reservoirs 105a, b, c, d defined by the body 101 configured to be in fluid communication with the one or more thermal fin arrays 103a, b, c, d, e, f, g. The phase change material can be disposed within the one or more reservoirs 105a such that it is configured to create a larger heat absorbing mass of phase change material in the body 101. In certain embodiments, the one or more reservoirs 105a, b, c, d may be left empty or only partially filled to allow phase change material to flow into the one or more reservoirs 105a, b, c, d if the phase change material needs space to expand into. Any suitable number and/or volume of reservoirs are contemplated herein.

The one or more reservoirs 105a, b, c, d and the one or more thermal fin arrays 103a, b, c, d, e, f, g can be in fluid communication via one or more channels 107a, b, c, d, e, f, g, h, i, j, k, l, m. The one or more thermal fin arrays 103a, b, c, d, e, f, g, the one or more channels 107a, b, c, d, e, f, g, h, i, j, k, l, m, and/or the one or more reservoirs 105a, b, c, d can be open to an atmosphere (e.g., as shown) such that the one or more thermal fin arrays 103a, b, c, d, e, f, g and/or the one or more reservoirs 105a, b, c, d are in fluid communication with an atmosphere (e.g., such that the phase change material is not sealed within the body 101). In certain embodiments, the heatsink 100 can include a top configured to seal in the phase change material to prevent loss in use, for example. Therefore, in certain embodiments, the phase change material may be sealed within the body 101. Any other suitable structure is contemplated herein.

The one or more thermal fin arrays 103a, b, c, d, e, f, g can include a plurality of thermal fin arrays 103a, b, c, d, e, f, g spaced apart from each other, e.g., as shown. Referring additional to FIG. 2, in certain embodiments, a location and/or size of each of the plurality of fin arrays 103a, b, c, d, e, f, g can correlate to a position of a component 203a, b, d, e, f on a circuit board 201. Any other suitable size, shape, and/or location of the one or more fin arrays 103a, b, c, d, e, f, g are contemplated herein.

In certain embodiments, at least two of the thermal fin arrays 103a, b, c, d, e, f, g can have different sized thermal fins 109, 111, 113, for example. Any suitable shape (e.g., rectangular towers as shown) and/or size for the thermal fins 109, 111, 113 of each thermal fin array is contemplated herein. In certain embodiments, e.g., as shown, all thermal fins can be the same length (e.g., extending out to an outer surface 115 of the body 101. Any suitable length is contemplated herein, whether the same or different for other thermal fins.

In certain embodiments, all thermal fin arrays 103a, b, c, d, e, f, g and all reservoirs 105a, b, c, d can be in fluid communication with each other, e.g., as shown, such that all thermal fin arrays 103a, b, c, d, e, f, g and all reservoirs 105a, b, c, d share the same volume of phase change material. In certain embodiments, e.g., as shown, the fin arrays can be in fluid communication with each other. In certain embodiments, one or more fin arrays may not be in fluid communication with one or more other fin arrays. Any suitable arrangement of fluid communications is contemplated herein.

In certain embodiments, the one or more reservoirs 105a, b, c, d include a plurality of reservoirs 105a, b, c, d (e.g., four, one in each corner). Any suitable number of reservoirs are contemplated herein.

In certain embodiments, a contact surface 121 (e.g., a surface of the body 101 opposite a surface, e.g., outer surface 115, having the thermal fins) can be configured to connect to a circuit board 201. For example, the contact surface 121 can be flat, e.g., as shown. Any suitable shape is contemplated herein.

In certain embodiments, the heatsink 100 can be milled from a block of material (e.g., aluminum or other suitable heat transfer material) to form the thermal fins, channels, and reservoirs. Any other suitable method of manufacture is contemplated herein.

In accordance with at least one aspect of this disclosure, an electronics system 200 can include a circuit board 201 having one or more components, e.g., 203a, b, d, e, f as shown in FIG. 2, that output heat. The system 200 can also include a heatsink 100 attached (e.g., via a thermal adhesive or otherwise contacting and/or attached) to the one or more components 203a, b, d, e, f and/or the circuit board 201 to be in thermal communication with the one or more components 203a, b, d, e, f. The heatsink 100 can be any suitable embodiment of a heatsink 100 disclosed herein, e.g., as described above. The electronics system 200 can be utilized with any suitable single use device (e.g., a projectile such as guided munitions) and/or any other suitable device.

In accordance with at least one aspect of this disclosure, a single use device (e.g., a projectile) can include any suitable embodiment of an electronics system 200 as disclosed herein (e.g., as described above). In certain embodiments, the phase change material of the heatsink 100 may not be sealed within the heatsink 100, e.g., as disclosed above. Any suitable single use device (e.g., a guided munition) and/or any other suitable device is contemplated herein.

Embodiments can include fins that are tailored based on thermal load and transfer rate. Embodiments can have any suitable size, shape, or pattern of thermal fins, for example. Embodiments can include fin locations that are commensurate with chip locations for maximum heat transfer efficiency. Embodiments can provide a completely passive thermal transfer device that can exist in thermal communication with electronics in an enclosed space without any other pathway for heat to leave. Embodiments do not require power. The heat from the electronics can be stored in the phase change material (PCM) in the heatsink and may not otherwise be actively transferred anywhere else.

In embodiments, the top can be closed or open, and leakage can be acceptable in single use devices because the heatsink will not be reused. Not having a top can allow for a reduced weight of the heatsink. Any other application with a short concept of operations (CONOP) can benefit from this structure where heat is stored more so than transferred. The PCM is phase reversible, so it can be reused if allowed to cool back down (which can happen even in single use cases). In such applications, any suitable heat removal (e.g., natural radiation or active system for cooling is contemplated herein). For example, embodiments of the heatsink can be made out of a black body (e.g., painted black). Any suitable radiation enhancing features are contemplated (e.g., fins on outer edges, etc.).

The amount of PCM used (total volume in heat sink) can be a function of heat capacity of a specific PCM and the expected amount of heat that will be generated in an operation (and for how long). Any suitable PCM and any suitable amount is contemplated herein.

Structures can be micromachined, etched, additively manufactured, and/or laser cut. Any suitable manufacturing technique.

Embodiments include a heatsink that absorbs heat temporarily in a PCM and does not transfer heat out as quickly as it is absorbed. Embodiments can include a structure that has one side that is flat for attaching to heat source components, and another side that can have similarly located microstructures for transferring heat efficiently to the PCM in the heatsink. These devices provide both structure support and heat spreading.

One of the major thermal issues in shrinking electronics is power density. Electrical components such as MCMs (multi-chip modules) have high power density and could be located at the center of a board and also be part of a multi-board stack. Heatsinks could be placed in between these boards in a stack and may not be sufficient on their own to disperse the heat. Embodiments utilize a passive technique that can be used directly at the heat source to absorb or at some distance to drive thermal transport. This passive technique can allow for heat absorption and thermal transfer without input of electrical energy, reserving more power for the electronics.

In embodiments, initially the PCM will increase in temperature as the electronics give off heat. Near the phase change material the PCM can absorb heat without increasing in temperature until all the material has changed states. This can allow the electronics to maintain a more stable and lower temperature, increasing performance. Microstructures (e.g., thermal fins) can be left behind after a machining process and create large surface area to transfer heat into the PCM.

In certain embodiments, after the micro channels are machined around the microstructures, flow channels away from the heat source can also be machined. These micro channels and flow channels can be filled with PCM to absorb heat. These flow channels can be used for thermal transport as well as resolve a pressure build up as the PCM melts and potentially pushes outwards. Reservoirs can also be machined at various locations including the outer edges, and fully or partially filled to accept the thermal transport and create a type of thermal capacitor or partially filled or empty to accept material that gets pushed through the flow channels due to thermal expansion. The micro channels and micro structures can cover most or all of the surface of the heatsink in certain embodiments.

A benefit of using embodiments of this disclosure, especially for electronics that have a CONOP where circuits and thus heat sources are turned on and off throughout its use, is that certain embodiments are reusable throughout the operation. The PCM within the various pockets in the heatsink can melt as it absorbs heat but can then cool and solidify as the nearby circuit is turned off, allowing the material to absorb heat again when the circuit is restarted.

Heatsink materials such as Aluminum 7068-T6511 provides both high conductivity 190 W/mK and high strength ~99 ksi or Copper Alloy C11000 with ~390 W/mK and up to ~57 ksi ultimate tensile strength. These materials have higher thermal conductivity values and yet maintain fairly good strength. PCM materials, e.g., paraffin wax, can be used and doped with particles such as graphite to increase the thermal conductivity. Any suitable material is contemplated herein.

In cases where electronics must be very close together in a stack, the z-height dimension can be incredibly important because it is a much shorter distance than the width of a possible heatsink that fits between circuit boards in the stack. Thermal energy can only travel so far in a given time, depending on the material properties, and with embodiments of this disclosure using micro structures and channels directly above the heat source, the distance into the PCM can be very short. Such embodiments can allow the heat to transfer quickly into the PCM.

In cases where heatsink structural support is needed for high acceleration conditions, patterns can be machined into the heatsink to store PCM, transfer heat, and provide structural support. Patterns such as grids can be used, for example. Any other suitable pattern is contemplated herein. Potentially more supportive structure like honeycombs (if an outlet flow channel is machined or drilled) is contemplated herein. High density electronics, such as a multi-chip modules (MCM), can be on the forward side of a printed circuit board to improve robustness under setback forces. A flat surface on the aft side of the heatsink can improve surface area for thermal transfer from the MCM. If the electronics are not an MCM but rather individual components, the heatsink can have bosses that reach down and make maximum thermal contact. The forward side of the heatsink can house the phase change materials, structures and channels. This can minimize the amount of bending that the heatsink could undergo during setback acceleration. Lastly patterns can be customized to have a larger number of features near hot components or tailored for structural strength. Certain embodiments can include different depths of features, for example Machined structures could be tailored for specific mechanical or thermal properties. Some examples for thermal fins might include thin fins, rectangular towers, or pyramids, for example.

Embodiments deal with heat generation at the source and can use micromachining of heatsinks to create patterned structures to act as an array of thermal fins and channels to be filled with phase changing material. These channels can be connected to reservoirs, either empty to provide space for material thermal expansion or filled with similar material to collect heat and act as a thermal capacitor. In addition, e.g., through micromachining or other suitable approach, the majority of the heatsink material can be left behind, allowing it to maintain most of its structural strength which can be beneficial for high acceleration environments.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising"

can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A heatsink, comprising:
    a body;
    a plurality of thermal fin arrays defined by and/or extending from the body;
    a phase change material disposed in contact with the one or more fin arrays, the phase change material configured to be a first phase in a cool state and a second phase in a heated state, wherein the phase change material is configured to be cooled back to the solid state; and
    a plurality of reservoirs defined by the body configured to be in fluid communication with the plurality of thermal fin arrays, a respective fin array of the plurality of fin arrays disposed in a respective reservoir of the plurality of reservoirs, wherein the phase change material is disposed within the plurality of reservoirs and configured to create a larger heat absorbing mass of phase change material, wherein the plurality of reservoirs and the plurality of thermal fin arrays are in fluid communication via a plurality of channels, wherein the plurality of thermal fin arrays are spaced apart from each other, wherein the plurality of thermal fin arrays and the plurality of reservoirs are in fluid communication with each other such that all thermal fin arrays and all reservoirs share the same volume of phase change material, wherein the plurality of channels are machined around the plurality of fin arrays, wherein the plurality of reservoirs are machined at various locations.

2. The heatsink of claim 1, wherein the plurality of thermal fin arrays, the plurality of channels, and/or the plurality of reservoirs are open to an atmosphere such that the plurality of thermal fin arrays and/or the plurality of reservoirs are in fluid communication with an atmosphere.

3. The heatsink of claim 2, wherein a location and/or size of each of the plurality of fin arrays correlates to a position of a component on a circuit board.

4. The heatsink of claim 3, wherein at least two of the thermal fin arrays have different sized thermal fins.

5. The heatsink of claim 1, wherein a contact surface configured to connect to a circuit board is flat.

6. An electronics system, comprising:
    a circuit board having one or more components that output heat;
    a heatsink attached to the one or more components and/or the circuit board to be in thermal communication with the one or more components, the heatsink comprising:
        a body;
        a plurality of thermal fin arrays defined by and/or extending from the body;
        a phase change material disposed in contact with the one or more fin arrays, the phase change material configured to be a first phase in a cool state and a second phase in a heated state, wherein the phase change material is configured to be cooled back to the solid state; and
    a plurality of reservoirs defined by the body configured to be in fluid communication with the plurality of thermal fin arrays, a respective fin array of the plurality of fin arrays disposed in a respective reservoir of the plurality of reservoirs, wherein the phase change material is disposed within the plurality of reservoirs and configured to create a larger heat absorbing mass of phase change material, wherein the plurality of reservoirs and the plurality of thermal fin arrays are in fluid communication via a plurality of channels, wherein the plurality of thermal fin arrays are spaced apart from each other, wherein the plurality of thermal fin arrays and the plurality of reservoirs are in fluid communication with each other such that all thermal fin arrays and all reservoirs share the same volume of phase change material, wherein the plurality of channels are machined around the plurality of fin arrays, wherein the plurality of reservoirs are machined at various locations.

7. The system of claim 6, wherein the plurality of thermal fin arrays, the plurality of channels, and/or the plurality of reservoirs are open to an atmosphere such that the one or more thermal fin arrays and/or the one or more reservoirs are in fluid communication with an atmosphere.

8. The system of claim 7, wherein the plurality of reservoirs are machined into the body a location correlating to a position of a respective component on the circuit board, and wherein a size of each respective fin array of the plurality of fin arrays correlates to the respective component on the circuit board.

9. The system of claim 8, wherein at least two of the thermal fin arrays have different sized thermal fins.

10. A single use device, comprising:
    an electronics system, comprising:
        a circuit board having one or more components that output heat;
        a heatsink attached to the one or more components and/or the circuit board to be in thermal communication with the one or more components, the heatsink comprising:
            a body;
            a plurality of thermal fin arrays defined by and/or extending from the body;
            a phase change material disposed in contact with the one or more fin arrays, the phase change material configured to be a first phase in a cool state and a second phase in a heated state, wherein the phase change material is configured to be cooled back to the solid state, wherein the phase change material is not sealed within the heatsink; and a plurality of reservoirs defined by the body configured to be in fluid communication with the plurality of thermal fin arrays, a respective fin array of the plurality of fin arrays disposed in a respective reservoir of the plurality of reservoirs, wherein the phase change material is disposed within the plurality of reservoirs and configured to create a larger heat absorbing mass of phase change material, wherein the plurality of reservoirs and the plurality of thermal fin arrays are in fluid communication via a plurality of channels, wherein the plurality of thermal fin arrays are spaced apart from each other, wherein the plurality of thermal fin arrays and the plurality of reservoirs are in fluid communication with each other such that all thermal fin arrays and all reservoirs share the same volume of phase change material, wherein the plurality of channels are machined around the plurality of fin arrays, wherein the plurality of reservoirs are machined at various locations.

\* \* \* \* \*

UNITED STATES PATENT AND TRADEMARK OFFICE
CERTIFICATE OF CORRECTION

| | | |
|---|---|---|
| PATENT NO. | : 12,082,374 B2 | Page 1 of 1 |
| APPLICATION NO. | : 17/497671 | |
| DATED | : September 3, 2024 | |
| INVENTOR(S) | : Jason Graham | |

It is certified that error appears in the above-identified patent and that said Letters Patent is hereby corrected as shown below:

In the Specification

In Column 1, Line 7, delete "DOTC-19 INIT0911" and insert --DOTC-19-01-INIT0911-- therefor Signed and Sealed this
Twenty-sixth Day of August, 2025

Coke Morgan Stewart
*Acting Director of the United States Patent and Trademark Office*